United States Patent
Abo Foul et al.

(10) Patent No.: US 11,514,219 B1
(45) Date of Patent: Nov. 29, 2022

(54) SYSTEM AND METHOD FOR ASSERTION-BASED FORMAL VERIFICATION USING CACHED METADATA

(71) Applicant: Cadence Design Systems, Inc., San Jose, CA (US)

(72) Inventors: Ahmad S. Abo Foul, Jatt (IL); Lars Lundgren, Molnlycke (SE); Björn Håkan Hjort, Gothenburg (SE); Habeeb Farah, Nazareth (IL)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/212,150

(22) Filed: Mar. 25, 2021

(51) Int. Cl.
*G06F 30/3323* (2020.01)

(52) U.S. Cl.
CPC .................. *G06F 30/3323* (2020.01)

(58) Field of Classification Search
USPC .......................................................... 716/106
See application file for complete search history.

(56) References Cited

U.S. PATENT DOCUMENTS

| | | | | |
|---|---|---|---|---|
| 10,956,640 | B1* | 3/2021 | Safe | G06N 7/005 |
| 11,150,298 | B1* | 10/2021 | Bingham | G01R 31/318357 |
| 2006/0248481 | A1* | 11/2006 | Baumgartner | G06F 30/30 |
| | | | | 716/103 |
| 2006/0248482 | A1* | 11/2006 | Baumgartner | G06F 30/30 |
| | | | | 716/104 |
| 2006/0248483 | A1* | 11/2006 | Baumgartner | G06F 30/30 |
| | | | | 716/104 |
| 2006/0248484 | A1* | 11/2006 | Baumgartner | G06F 30/30 |
| | | | | 716/104 |
| 2006/0248494 | A1* | 11/2006 | Baumgartner | G06F 30/30 |
| | | | | 716/103 |
| 2007/0087756 | A1* | 4/2007 | Hoffberg | G06Q 20/065 |
| | | | | 455/450 |
| 2007/0220461 | A1* | 9/2007 | Baumgartner | G06F 30/3323 |
| | | | | 716/103 |
| 2010/0257494 | A1* | 10/2010 | Pouarz | G06F 30/3323 |
| | | | | 716/111 |
| 2017/0212968 | A1* | 7/2017 | Diao | G06F 30/33 |
| 2022/0018988 | A1* | 1/2022 | Obathani | G01V 99/005 |

* cited by examiner

*Primary Examiner* — Mohammed Alam
(74) *Attorney, Agent, or Firm* — Mark H. Whittenberger; Holland & Knight LLP (57) ABSTRACT

The present disclosure relates to a system and method for assertion-based formal verification in an electronic design environment. Embodiments may include executing, using a processor, an assertion-based formal verification proof process on a model of an electronic design and analyzing a first property associated with the model. Embodiments may further include generating at least one trace of the first property and determining a mapping function associated with the first property. Embodiments may also include storing the at least one trace and the mapping function. Embodiments may further include determining that a second property associated with the model shares a cone of influence with the first property and generating a new trace based upon, at least in part, the mapping function.

20 Claims, 10 Drawing Sheets

Output Device
1004

Processor
1002

Memory
1006

Storage Device
1008

Input Device
1001

FIG. 10

SYSTEM AND METHOD FOR ASSERTION-BASED FORMAL VERIFICATION USING CACHED METADATA

FIELD OF THE INVENTION

The present invention relates to formal verification. More specifically the present invention relates to method and system for assertion-based formal verification using cached metadata.

BACKGROUND

Design verification is a common process for testing electronic designs (e.g., a newly designed integrated circuit, board, or system-level architecture), to, for example, confirm compliance with requirements that can be defined by a specification for that device. There are various approaches to verification. One approach typically employs logic simulation or emulation and/or circuit simulation, in which an electronic design (typically a model of the electronic design) is put to numerous simulation tests or emulation tests aimed at finding faults in the design (also called: bugs). Another approach is functional verification, in which functional models of the electronic design are generated and checked against the behavioral specification of the electronic design.

Formal verification is another approach, in which, rather than testing a design under test (DUT), a formal specification of the electronic design is analyzed and mathematically proven. A very common method of formal verification typically involves property checking, in which properties of the electronic design are checked in a functional or behavioral model of the electronic design against specified or presumed properties. Formal verification may also involve equivalence checking in which a functionality model of the electronic design is checked against a functionality model (e.g., a desired or verified model) of the electronic design.

During property checking (sometimes also referred to as "assertion-based formal verification"—ABFV), as a proof process progresses, the model of the electronic design and/or property setup and/or property formulation may change, leading to changes in some properties while unaffecting other properties. A property may capture a specification precisely using notations that have formalized semantics, intended to describe planned behavior of the DUT. Properties are typically described in various property languages, for example, SystemVerilog Assertions (SVA) and Property Specification Language (PSL).

Each time property checking is reiterated, as is typically the manner in which property checking is conducted, the same set of properties may be checked over and over again, resulting in heavy computational burden, which, may be futile and wasteful, if for a property being checked, the formulation of that property, the part or parts of the model of the electronic design that relate to that property and that property setup, together forming the cone of influence (COI), have not changed.

It may be desired to easily identify whether any change was made in the COI relating to a specific property, in the model of the electronic design e.g., when reiterating property checking and/or when signing off regression results roll-up, in order to save time and computational resources.

SUMMARY

In one or more embodiments of the present disclosure, a computer-implemented method for assertion-based formal verification in an electronic design environment is provided. The method may include executing, using a processor, an assertion-based formal verification proof process on a model of an electronic design and analyzing a first property associated with the model. The method may further include generating at least one trace of the first property and determining a mapping function associated with the first property. The method may also include storing the at least one trace and the mapping function. The method may further include determining that a second property associated with the model shares a cone of influence with the first property and generating a new trace based upon, at least in part, the mapping function.

One or more of the following features may be included. The method may include computing a second mapping function for the second property. The first property may be from a first model and the second property is from a second model, wherein the first model and second model are different. Analyzing may include attempting to disprove the first property. Generating a new trace is performed without running a formal engine. The first model may be from a first electronic design and the second model may be from a second electronic design. The mapping function may be based upon, at least in part, one or more nets associated with the first electronic design or second electronic design and one or more corresponding nets in the cone of influence.

In one or more embodiments of the present disclosure a computer-readable storage medium having stored thereon instructions, which when executed by a processor result in one or more operations is provided. Operations may include receiving, at a graphical user interface, one or more user settings to enable cone of influence based caching with traces. Operations may also include executing, using a processor, an assertion-based formal verification proof process on a task of an electronic design. Operations may also include analyzing a first property associated with the task and generating at least one trace of the first property. Operations may further include determining a cone of influence based signature and a mapping function and storing the at least one trace and the mapping function. Operations may also include determining that a second property associated with the task shares a cone of influence with the first property and generating a new trace based upon, at least in part, the mapping function One or more of the following features may be included. Operations may include computing a second mapping function for the second property. The first property may be from a first task and the second property is from a second task, wherein the first task and second task are different. Analyzing may include attempting to disprove the first property. Generating may be performed without running a formal engine. The first task may be from a first electronic design and the second task may be from a second electronic design. The mapping function may be based upon, at least in part, one or more nets associated with the first electronic design or second electronic design and one or more corresponding nets in the cone of influence.

In one or more embodiments of the present disclosure, a system for assertion-based formal verification in an electronic design environment is provided. The system may include at least one processor configured to execute an assertion-based formal verification proof process on a model of an electronic design. The at least one processor may be further configured to analyze a first property associated with the model and to generate at least one counterexample and at least one trace of the first property. The at least one processor may be further configured to determine a mapping function associated with the first property and to store the at least one trace and the mapping function. The at least one processor may be further configured to determine that a second property associated with the model shares a cone of influence with the first property and to generate a new trace based upon, at least in part, the mapping function.

One or more of the following features may be included. The system may include a database including one or more trace files or mapping function files.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Assertion-based formal verification typically requires significant user effort and can often be extremely costly in terms of computing resources as a result of running formal engines in order to prove or disprove a set of properties.

Typically, there are two phases of formal verification, an initial phase and a regression phase. At the initial phase, a partial proof can be iterated until satisfying results are reached. At the regression phase, the verification expert can replay periodically (e.g., daily, weekly, etc.) an existing proof, after a change or changes are made to model of the electronic design being checked.

In many instances, design changes do not affect the formal verification environment at all. Even when changes do affect the formal verification environment, these changes may be localized to a single design block, not affecting other parts of the model of the electronic design. Typically, the required proof effort in the regression phase is the same in each iteration, regardless of the scope of the changes.

Methods and systems according to some embodiments of the present invention may include calculating a unique signature value, for each property of the model of the electronic design, based on formulation of that property, the model of the electronic design, and the property setup. The unique signature value may be considered as a representation of a current verification status for that property.

The calculated unique signature value may be saved and used at a later time by retrieving previously saved (e.g, cached) unique signature values, and/or by caching new unique signature values, when a change in the formulation of that property, a change in the model of the electronic design for that property, or a change in the property setup occurs.

According to some embodiments of the present invention, when performing assertion-based formal verification, an assertion-based formal verification proof process may be executed on a model of an electronic design. Using a unique signature function, a unique signature value for each instantiation of a property of a plurality of properties of the model of the electronic design. A recalculation of the unique signature value for each instantiation of a property of the plurality of properties of the model of the electronic design may be performed, when reiterating the assertion-based formal verification proof process on the model of the electronic design, that iteration of the proof process may be performed only with respect to one or more properties of the plurality of properties whose unique signature value has changed in the recalculation.

By applying methods according to some embodiments of the present invention, for example when reiterating a formal proof only with respect to one or more properties of the plurality of properties whose unique signature value has changed in the recalculation, which is indicative of a change that was made to the formulation of that property, to the model of the electronic design, or to the property setup occurs, computing powers may be saved, and the time used for performing assertion-based formal verification may be shortened.

A unique signature value may be calculated using a function that may take into account the formulation of that property, the part or parts of the model of the electronic design which is relevant for that property, and the property setup (constraints, stopats, clock and reset configurations, etc.), which make up the COI relating to that instantiation of the property. Typically, the COI relates to the proof environment, the driving logic, the design characteristics of the DUT or a relevant part of the DUT (relevant to the property or properties being proven).

Then, the proof may be reiterated (e.g., in a partial proof or a full proof on the entire DUT), as is typically the case, during assertion-based formal verification, for example, after one or more changes are made to the design (e.g., to one or more properties being checked in the assertion-based formal verification), and/or to other entity in the COI affecting each of the instantiations of the properties in the model of the electronic design.

According to some embodiments of the present invention, instead of repeating the proof over all of the properties being checked in a previous iteration of the proof, the unique signature values for each of the properties of the DUT (e.g., including the previously checked properties) may be recalculated, and the proof process specifically applied only to properties whose unique signature value has changed from the previously calculated value.

Skipping properties having unchanged unique signature value may significantly save computing power, as typically, computations exhaust considerably less computing resources than formal verification proof processing.

Properties whose calculated unique signature value has not changed may be assumed to have remained unaffected by any change to the formulation of that property, the model of the electronic design for that property, or the property setup, despite the change or changes that may have been made thereby allowing these properties to be skipped in a reiteration of the formal verification proof.

According to some embodiments of the present invention the unique signature function may be a hash function, used for calculating a hash value for each instantiation of a property in the model of the electronic design, taking into account the formulation of that property, the model of the electronic design for that property, and the property setup.

In some embodiments of the present invention, an electronic design automation (EDA) tool may be provided. The EDA tool can be configured to compute, for example, in response to a compute command (e.g., a transaction control language (TCL) command) a unique hash value, e.g., a 68-digit hexadecimal hash value, for each instantiation of a property of a given set of properties of the DUT. The EDA tool can
return a list of element pairs, where the first element can be a property name and the second element can be a hash value of that property.

A calculated property hash value, according to some embodiments of the present invention is a representation of the verification problem as affected by that instantiation of the property.

An EDA (and/or a user employing the EDA tool) may save computing resources by using a hash value computing prior to running a full proof on a design/environment that has minimally changed or has not changed at all. Referring to the computed hash value prior to running can allow retrieval of already known cached proof result from a centralized database, and saving of new proof results to optimize subsequent proofs. According to some embodiments of the present invention, formal engine computing resources that would otherwise be required to reproduce previous proof results may be saved. In some embodiments, for sign-off, property hash values can be used to identify the preferred regression runs, as explained hereinafter.

Figure 1:
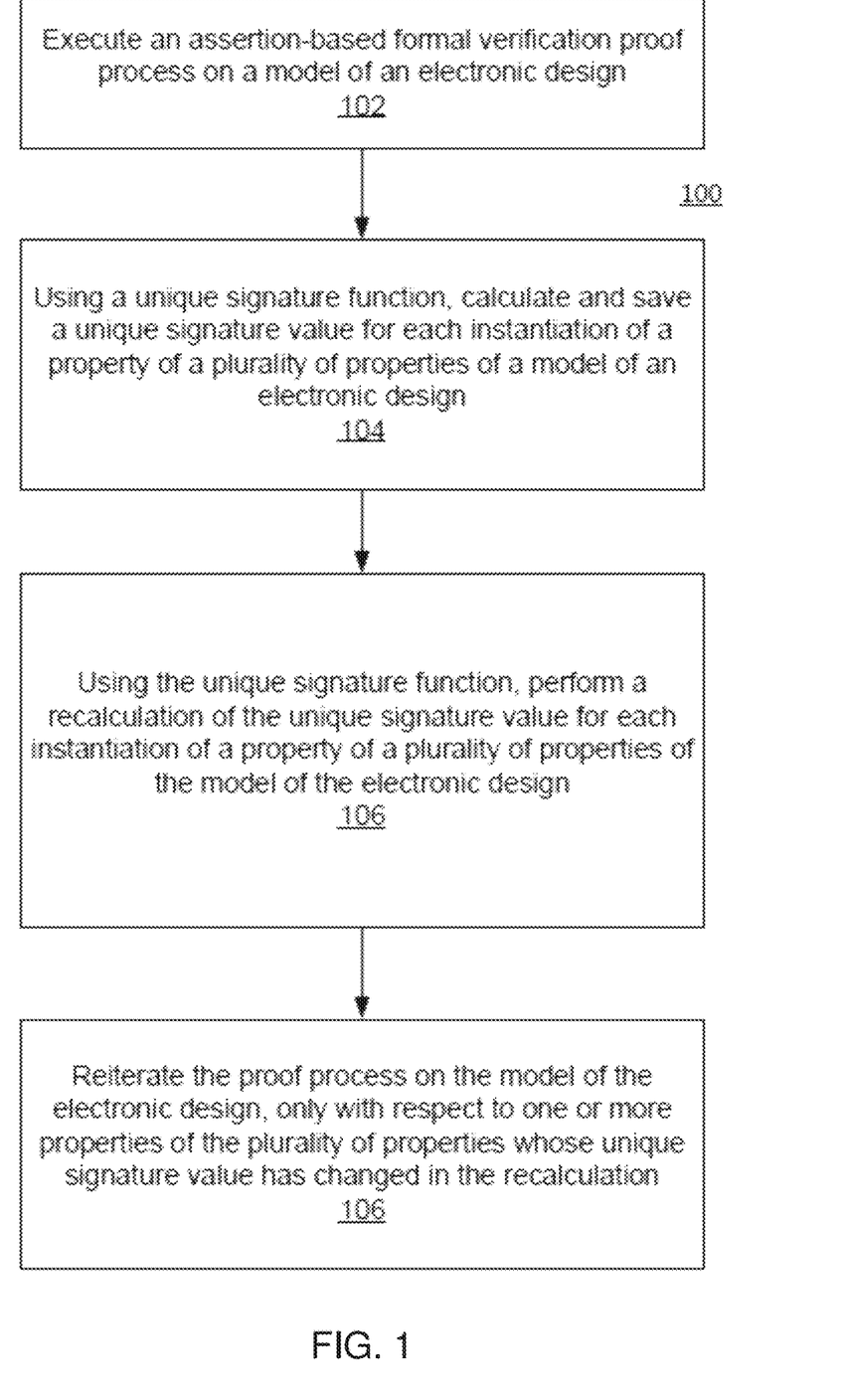
FIG. 1 shows a method for performing an assertion-based formal verification, according to some embodiments of the present invention.

FIG. 1 shows a method 100 for performing an assertion-based formal verification, according to some embodiments of the present invention. According to some embodiments, method 100 may be fully performed by an EDA tool.

Method 100 may include, using a unique signature function, calculating 102 and saving a unique signature value for each instantiation of a property of a plurality of properties of a model of the electronic design.

Method 100 may also include using the unique signature function, performing 104 a recalculation of the unique signature value for each instantiation of a property of a plurality of properties of the model of the electronic design.

Method 100 may also include reiterating 106 the proof process on the model of the electronic design, only with respect to one or more properties of the plurality of properties whose unique signature value has changed in the recalculation.

In some embodiments of the present invention, the unique signature function takes into account a COI in the model of the electronic design leading to that instantiation of the property In some embodiments of the invention, the EDA tool is configured to receive one or more changes to the model of the electronic design. In some instances such change or changes may affect the COI or changes to the proof environment (e.g., change in the constraints). In some embodiments of the present invention, the change or changes are provided by a user, e.g., via a user interface (UI).

The unique signature value for each instantiation of a property of the properties may be saved in a database, and later retrieved. Similarly, the recalculated unique signature values may also be saved in a database (e.g., same database) for later reference.

Figure 2:
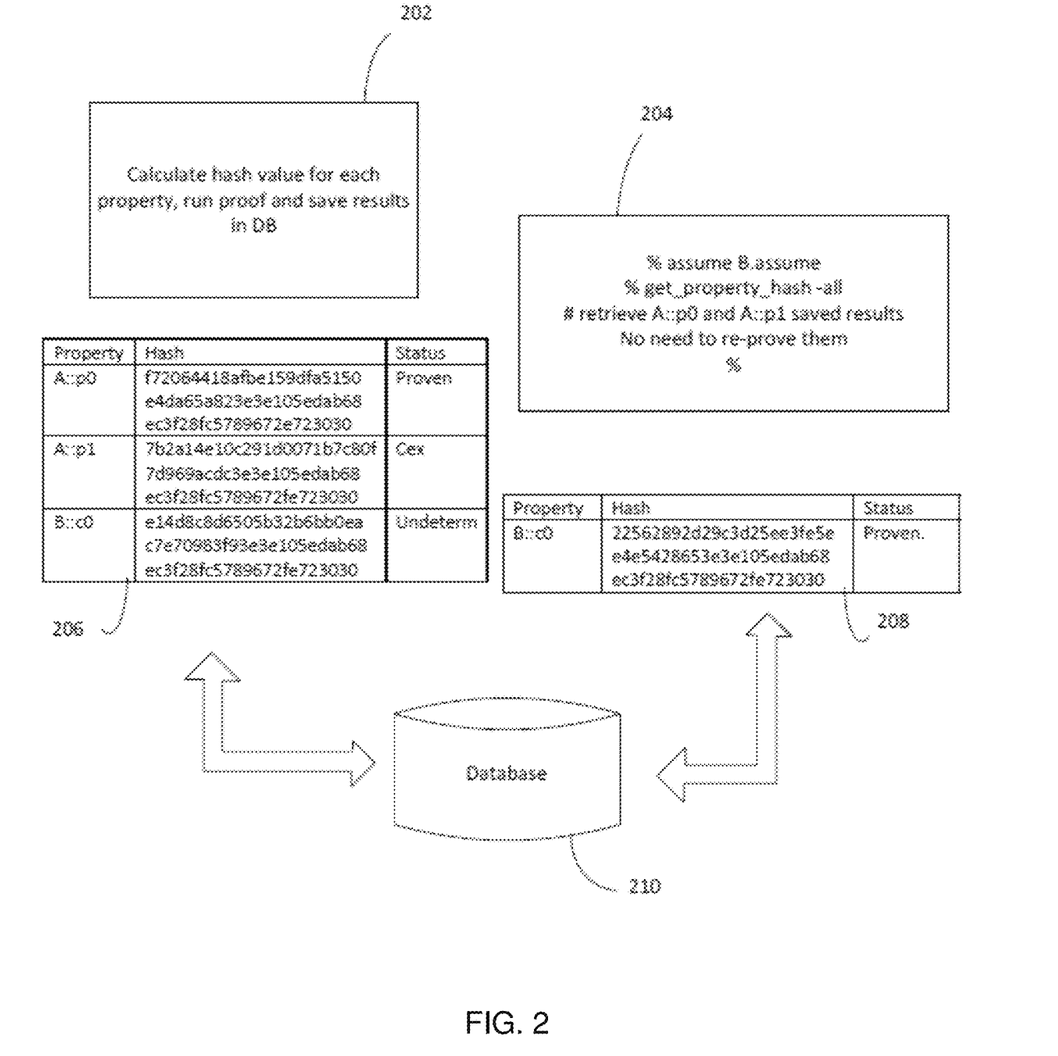
FIG. 2 shows an example of using unique signature values in assertion-based formal verification, according to some embodiments of the present invention.

FIG. 2 shows an example of using unique signature values in assertion-based formal verification, according to some embodiments of the present invention.

An EDA tool may 202 calculate hash value for each property of a set of properties in a model of an electronic design. The EDA tool may run an assertion-based formal verification proof and save results data 206 of that proof in a database 210.

An EDA tool may offer a user an enhanced assertion-based formal verification approach, according to some embodiments of the present invention.

A user may initiate one or a set of commands that include, for example, TCL command or other type of commands.

For example, the user may enter a TCL command, such as, "% get_property_hash -all" which can cause the calculation of a unique hash number for each instantiation of properties in the model of the electronic design being tested. A proof process may be invoked by a user initiated TCL command, such as, "% prove -all", and/or a user initiated TCL command such as, "% save results to database" may cause data 206 to be saved (e.g., a table that includes the unique hash numbers for each instantiation of property and a status result for each instantiation of property) in a database 210. In some embodiments of the present invention each instantiation of property is saved and correlated to the hash number that was calculated for that instantiation.

The data may also include the proof results for each instantiation of the properties (e.g., proven, CEX or undetermined) and may be saved too (e.g., in the database).

At some later time a change may be affected, for example, a user may input command or commands, e.g., "% assume B.assume". In this example the change affects the proof environment.

The unique hash may be recalculated, automatically by the EDA tool or in response to a user initiated command, e.g., command "% get_property_hash -all" that causes the recalculation of all hash values for each instantiation of the properties of the model of the electronic design may be invoked. The previously saved hash numbers may be automatically retrieved by the EDA tool and compared with the newly recalculated hash numbers. The formal verification proof may be reiterated only with respect to the instantiations of properties which were affected by the change, which is determined by acquiring a new hash number due to the change. The data 208 may also be saved to the database 210.

By applying a method for assertion-based formal verification computing resources may be saved. For example, instead of reiterating a formal verification proof on all of the instantiations of properties in a design under test (DUT), only instantiations of properties that are affected by a change in the COI are taken into consideration in reiterations of the proof.

According to some embodiments of the present invention, an EDA applying a method for assertion-based formal verification refers to a graph representation of the electronic design model that includes information that is relevant to prove a given set of one or more properties, and relates to the formulation of each of these one or more properties, the model of the electronic design for each of the properties, and the property setup of each property.

The graph representation may be used by the model checker/s (formal verification engine/s) as input. A graph representation may include, for example, input nodes, combinational logic nodes, and sequential state nodes.

According to some embodiments of the present invention, per a given instantiation of a property, the parts of the graph representation relevant to the COI of that instantiation of the property may be pruned, to form a sub-graph representation relating to the COI for that property instantiation, which includes any logic that may affect the verification result for that property.

According to some embodiments of the invention, a string representing a traversal on the sub-graph representation may be generated, where the traversal is directed downstream the flow in the COI leading towards the checked property instantiation. Slight modifications to the original non-pruned graph representation (e.g. adding, removing or amending a property) may affect the graph structure (e.g., a change in a name, such as index number change, of a node on the graph) and potentially yield different unique signatures. This may be overcome by stabilizing the traversal, for example, by keeping the order in which the various elements of the components of the electronic design model in the COI are visited during the traversal.

The hash encoding (the computation of the hash values) may include, for example, using, for example, message digest (MD) encoding (e.g., MD5 encoding) of the string to produce the hash value.

Typically, in most formal verification scenarios, the work of the formal verification tool (e.g., EDA tool) is not complete—some properties are left undetermined due to capacity/complexity and time. The user would benefit from having as much resources (machines*time) as possible to work on this "tail" of medium and hard properties According to some embodiments of the invention, avoiding unnecessary iteration of the proof process with respect to properties whose unique signature remains unchanged (indicating that there were no changes to that formulation of these properties, the model of the electronic design for these properties, or the property setup of each of these properties) frees resources that would otherwise be required to reproduce proof results, and the EDA tool, according some embodiments of the invention, can use these saved resources to work on the remaining undetermined properties, saving computing power and time.

Figure 3:
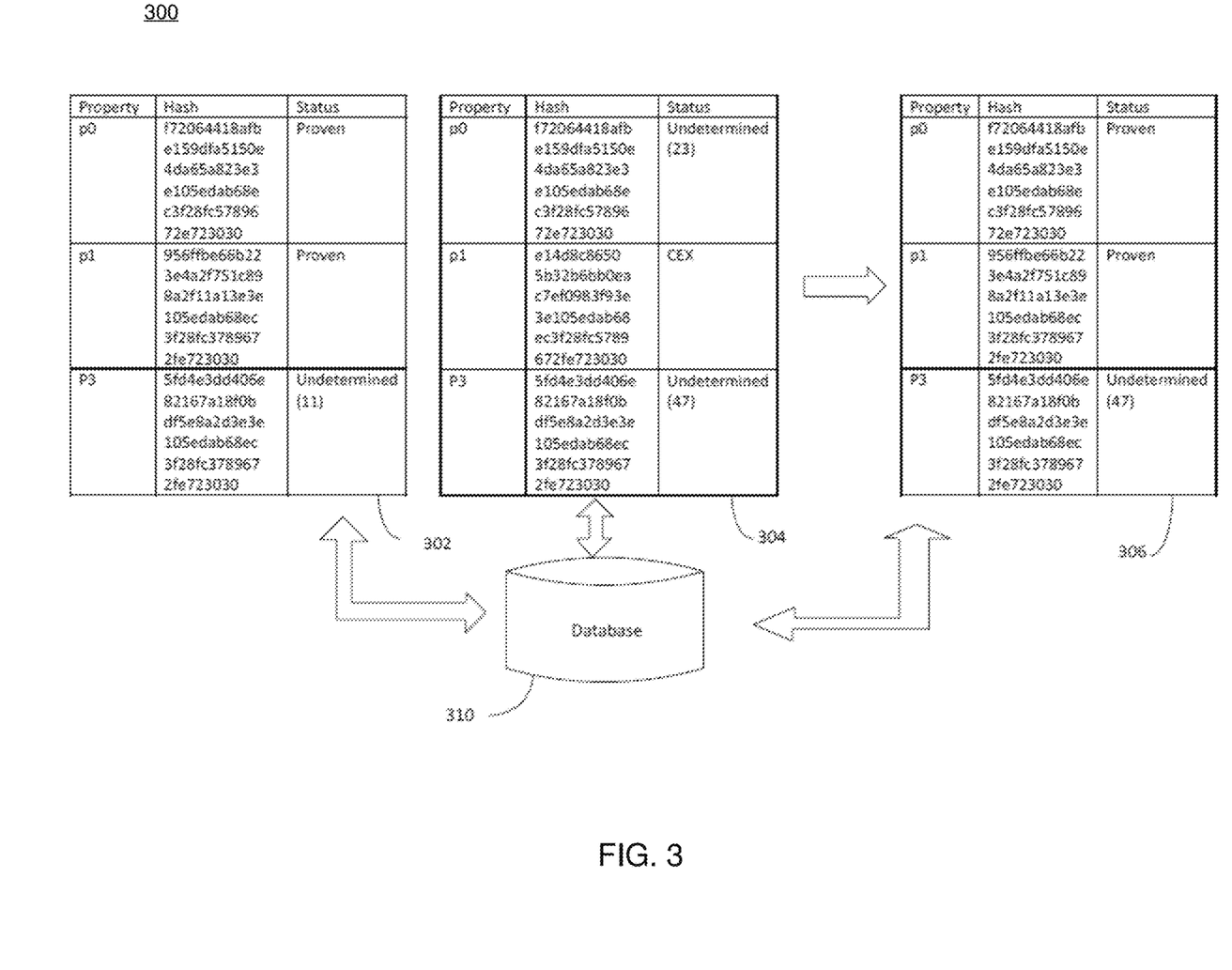
FIG. 3 shows another example of using unique signature values in assertion-based formal verification, according to some embodiments of the present invention.

FIG. 3 shows another example of using unique signature values in assertion-based formal verification, according to some embodiments of the present invention.

According to some embodiments of the invention, a plurality of formal verification regression runs on a model of an electronic design may be performed, in which, for each instantiation of property, for the properties of the model of the electronic design, a unique signature value, e.g., hash number, may be calculated. Data that includes the hash numbers, may be saved in a database 310. Tables 302 and 304 represent each regression run and include, each, a list instantiations of properties (p0, p1 and p3) that are included in the model of the electronic design, a hash number that was calculated for each instantiation of the properties, and a status result (e.g., proven, CEX or undetermined) for that regression run. In this example, the status results for the first regression run, as indicated in table 302, show that property instantiation p0 was proven, property instantiation p1 was proven, and property instantiation p3 was undetermined, with the number 11 in parenthesis indicating the greatest number of trace cycles (11 in this example) that are known to not have violated that instantiation of that property.

The status results for the second regression run, as indicated in table 304, show that property instantiation p0 was undetermined, with a maximum of 23 trace cycles that are known to not have violated that instantiation of the property, property instantiation p1 returned a CEX, and property instantiation p3 was undetermined, with a maximum of 47 trace cycles that are known to not have violated that instantiation of the property.

When the model of the electronic design eventually becomes free of CEX's, the user may sign off that current version of the model of the electronic design. In such current version of the model, all unique signature numbers represent either proven or undetermined statuses.

According to some embodiments of the present invention, the EDA tool may retrieve the data that was saved in the database for each regression run and identify the preferred status result that was achieved in any of the previous regression runs that was associated with the same unique signature value.

In the example shown in FIG. 3, property instantiation p0 was assigned the same hash number in the first and second regression runs, as in the final current version of the model represented by table 306, so the preferred status result for that property instantiation p0 is "proven".

Property instantiation p1 was "proven" in the first regression run and failed (CEX) in the second regression run. If the hash number of property instantiation p1 in the final (current) regression run is the same as the hash number of that property instantiation in the first regression run it may be established that for the final run this property (p1) is "proven" (without having to reiterate that proof). This may be determined as the hash numbers for the same property instantiation in the two regression runs—the first and the last, as in this example—are identical.

The status result for property instantiation p3 was undetermined for both regression runs, and was assigned in both of these runs the same hash number as in the final current version of the model. However, in the first regression run 11 trace cycles are known to not have violated that instantiation of property p3, whereas in the second regression run 47 trace cycles are known to not have violated that instantiation of property p3, so the preferred status result for that property instantiation is "undetermined (47)", as indicated in table 306.

According to some embodiments of the present invention, multiple assertion-based formal verification proof runs are cached by referring to the cached unique signature values the preferred verification results may be easily identified and used for sign-off roll-up.

In some embodiments, for a roll-up use case, automatic way is proposed to compare multiple runs and select the preferred results, while ensuring that the same formal verification environment has been maintained.

Figure 4:
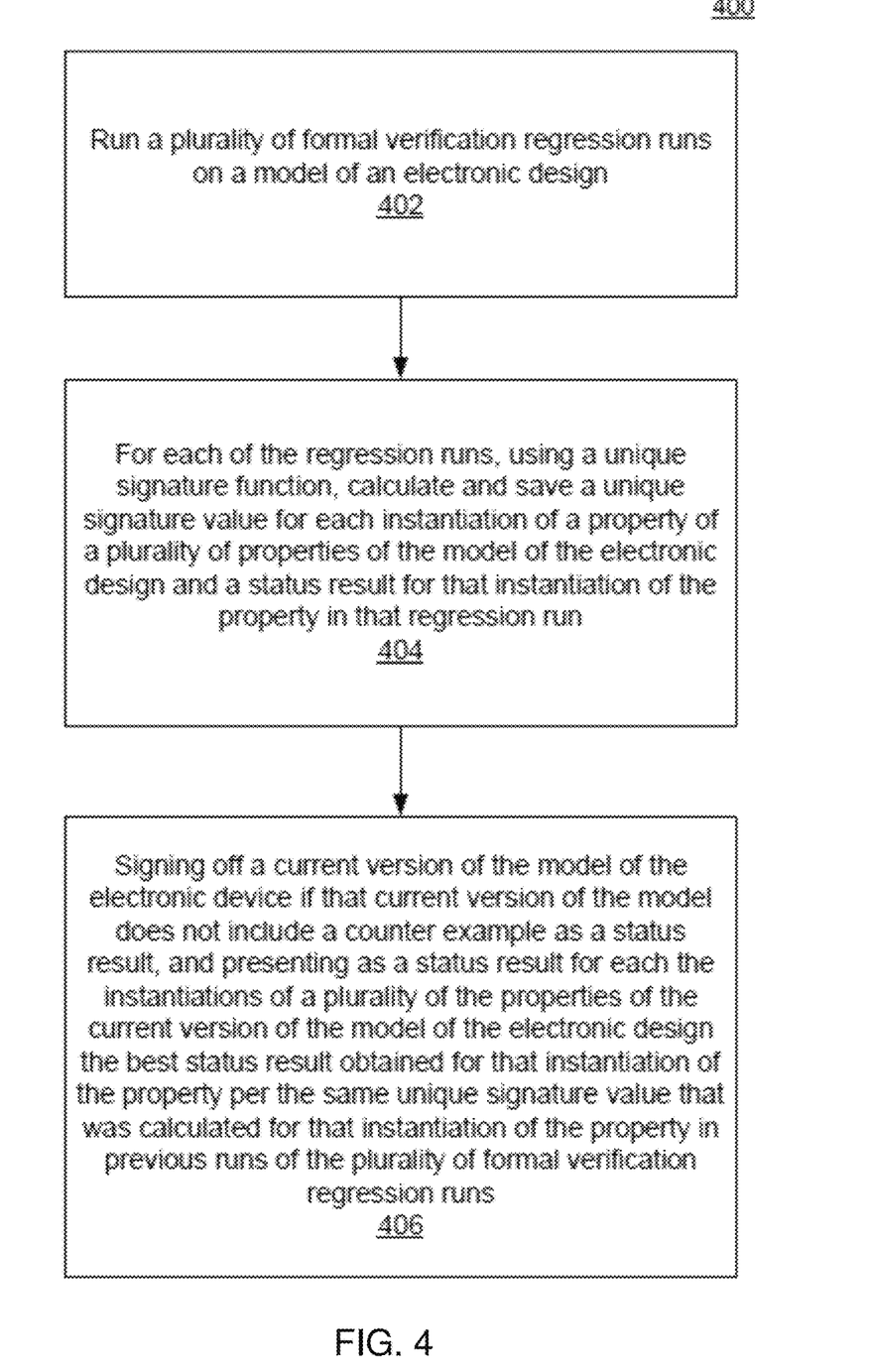
FIG. 4 shows another method for performing an assertion-based formal verification, according to some embodiments of the present invention.
Figure 5:
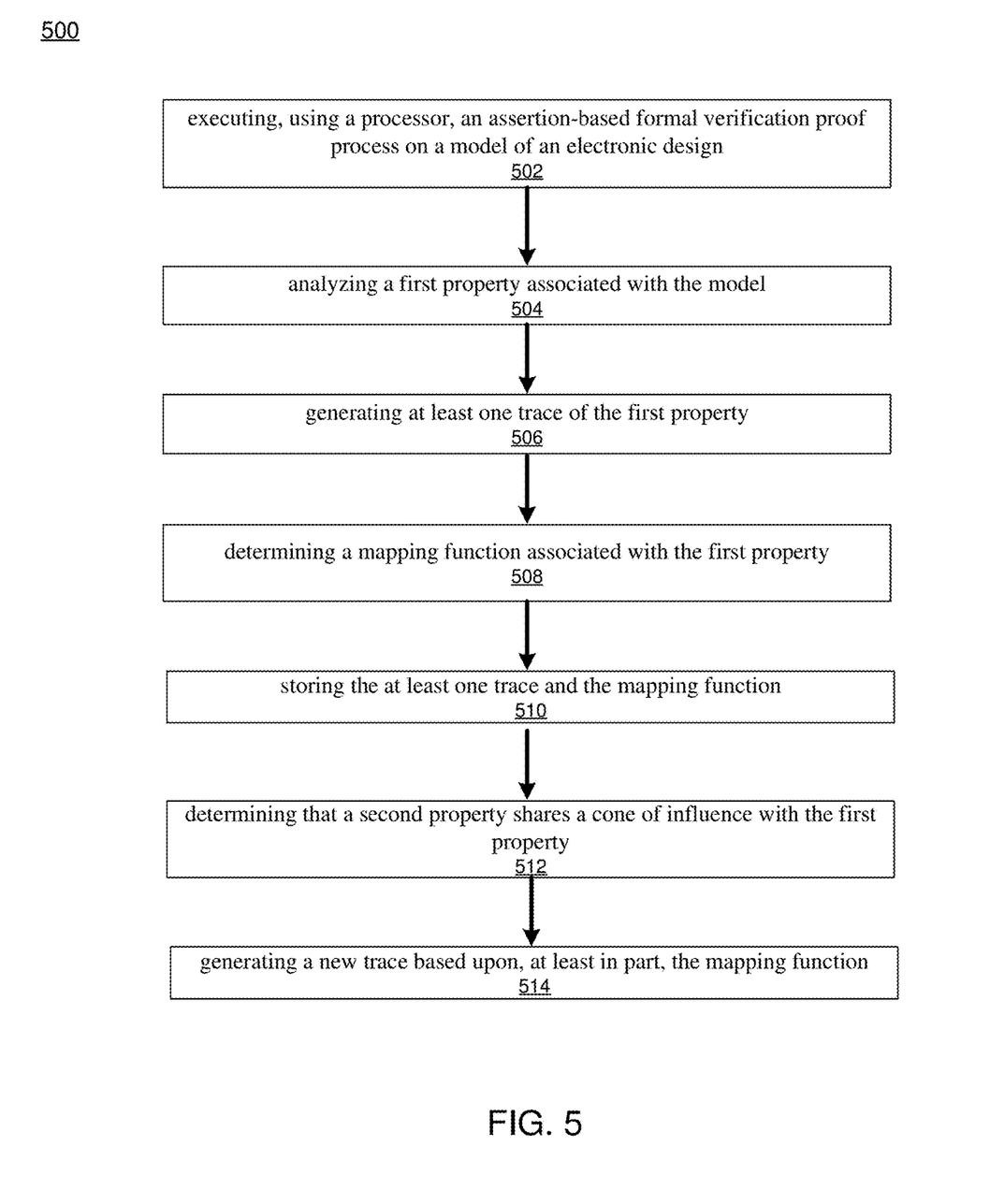
FIG. 5 shows yet another method for performing an assertion-based formal verification, according to some embodiments of the present invention.

FIG. 4 shows another method 400 for performing an assertion-based formal verification, according to some embodiments of the present invention.

Method 400 may include running 402 a plurality of formal verification regression runs on a model of an electronic design.

Method 400 may include, for each of the regression runs, using a unique signature function, calculating 404 and saving a unique signature value for each instantiation of a property of a plurality of properties of the model of the electronic design and a status result for that instantiation of the property in that regression run.

Method 400 may also include signing off 406 a current version of the model of the electronic device if that current version of the model does not include a counter example as a status result, and presenting as a status result for each the instantiations of a plurality of the properties of the current version of the model of the electronic design the preferred status result obtained for that instantiation of the property per the same unique signature value that was calculated for that instantiation of the property in previous runs of the plurality of formal verification regression runs.

Referring now to FIGS. 5-10, embodiments of the present disclosure directed towards an approach for generating new traces for properties with the same cone-of-influence (COI) using cached metadata is provided. As discussed above, formal verification is a hard problem that requires significant user effort and can often be extremely costly in terms of resources as a result of running formal engines in order to prove or disprove a set of properties. When disproving a property, the formal engine may provide a trace showing how and when the particular property violated and became counterexample (CEX). This trace is crucial for users to debug the failure in order to fix bugs in their formal verification environment.

In some embodiments, the trace generation process described herein may use cached metadata with appropriate mapping techniques to allow the EDA tool to generate new traces from scratch for properties that have a similar COI to different CEX properties that are previously cached without running any formal engines again in order to save significant time and computational resources.

Referring again to FIG. 5, a method for assertion-based formal verification in an electronic design environment including trace generation is provided. The method may include executing 502, using a processor, an assertion-based formal verification proof process on a model of an electronic design and analyzing 504 a first property associated with the model. The method may further include generating 506 at least one trace of the first property and determining 508 a mapping function associated with the first property. The method may also include storing 510 the at least one trace and the mapping function. The method may further include determining 512 that a second property shares a cone of influence with the first property and generating 514 a new trace based upon, at least in part, the mapping function. Each of these operations is discussed in further detail hereinbelow.

In existing systems, as the formal proof process progresses, the formal verification environment (e.g., design, property setup, property formulation) may change, leading to changes in some properties while leaving others unchanged. Users tried to use the current "Save and Restore" flow and the conventional caching mechanism in order to restore traces but both are not resilient against formal verification environment changes. For example, if the design was modified in any way, no traces were restored (even for those unaffected properties). Thus, formal engine computing resources are required over and over again.

Accordingly, embodiments of the trace generation process described herein provide a new capability to generate a new trace from scratch for a property that has a similar COI to a different CEX property that has been previously cached, without running any formal engines again. This capability is resilient against design and environment changes. For example, if the design is modified, the EDA tool should be able to produce traces for unaffected properties.

Figure 6:
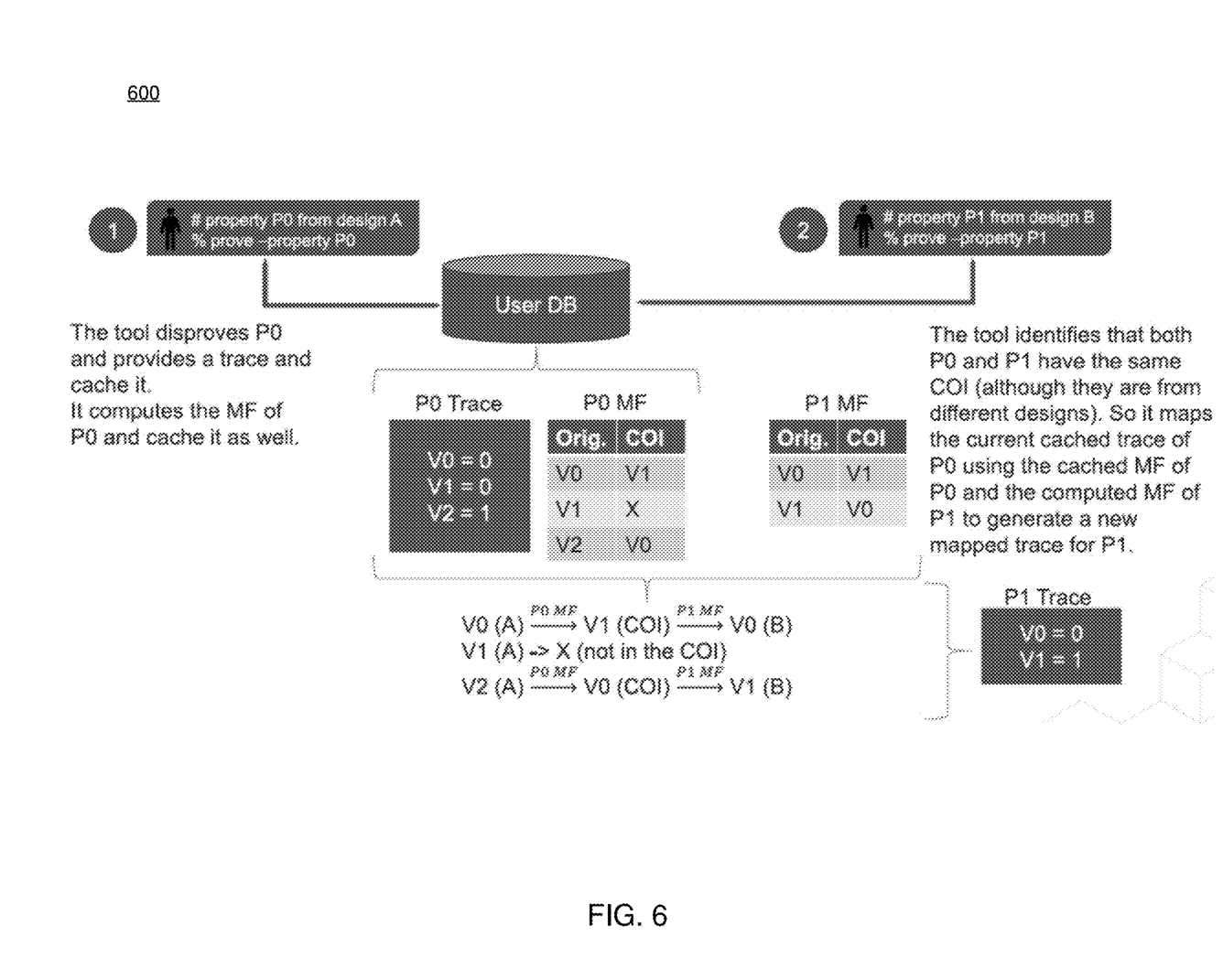
FIG. 6 is an illustration of a schematic of a trace generation method using cached metadata according to some embodiments of the present invention.

Referring now to FIG. 6, a diagram 600 showing the trace generation process and its interrelationship with a user database. In some embodiments, when the EDA tool disproves a property P0 from design A, it provides a trace for that and caches it in the user database. The EDA tool may be configured to compute a mapping function (MF) for this property which is the mapping of the nets in the original design to their correspondent nets in the COI and cache it as well in the user database. An example of such mapping might be: v3=v0, where variable #3 in the original design netlist is known to be variable #0 in the cut-COI.

In some embodiments, when running the EDA tool later to prove or disprove a different property P1 from a different design B where the property was identified by the EDA tool to have the same COI as for P0 from design A, trace generation process may generate a new mapped trace for P1 based on the cached trace of P0, the cached MF of P0, and the current computed MF of P1. This may be achieved by mapping P0 trace nets in design A to their correspondent nets in the COI using P0 cached MF. Then, those COI nets may be mapped to their corresponding nets in design B by using the computed MF of P1 since P0 and P1 share the same COT. In this way, the EDA tool sets P1 trace values of nets in design B as the trace values of correspondent nets in P0 trace.

In some embodiments, the user may save resources by using this capability when running a full proof on a design/environment that has changed such that some properties still unaffected to retrieve already cached traces from a centralized database, and to save new traces to optimize subsequent proofs. Thus, formal engine resources to reproduce traces may be saved.

Figure 7:
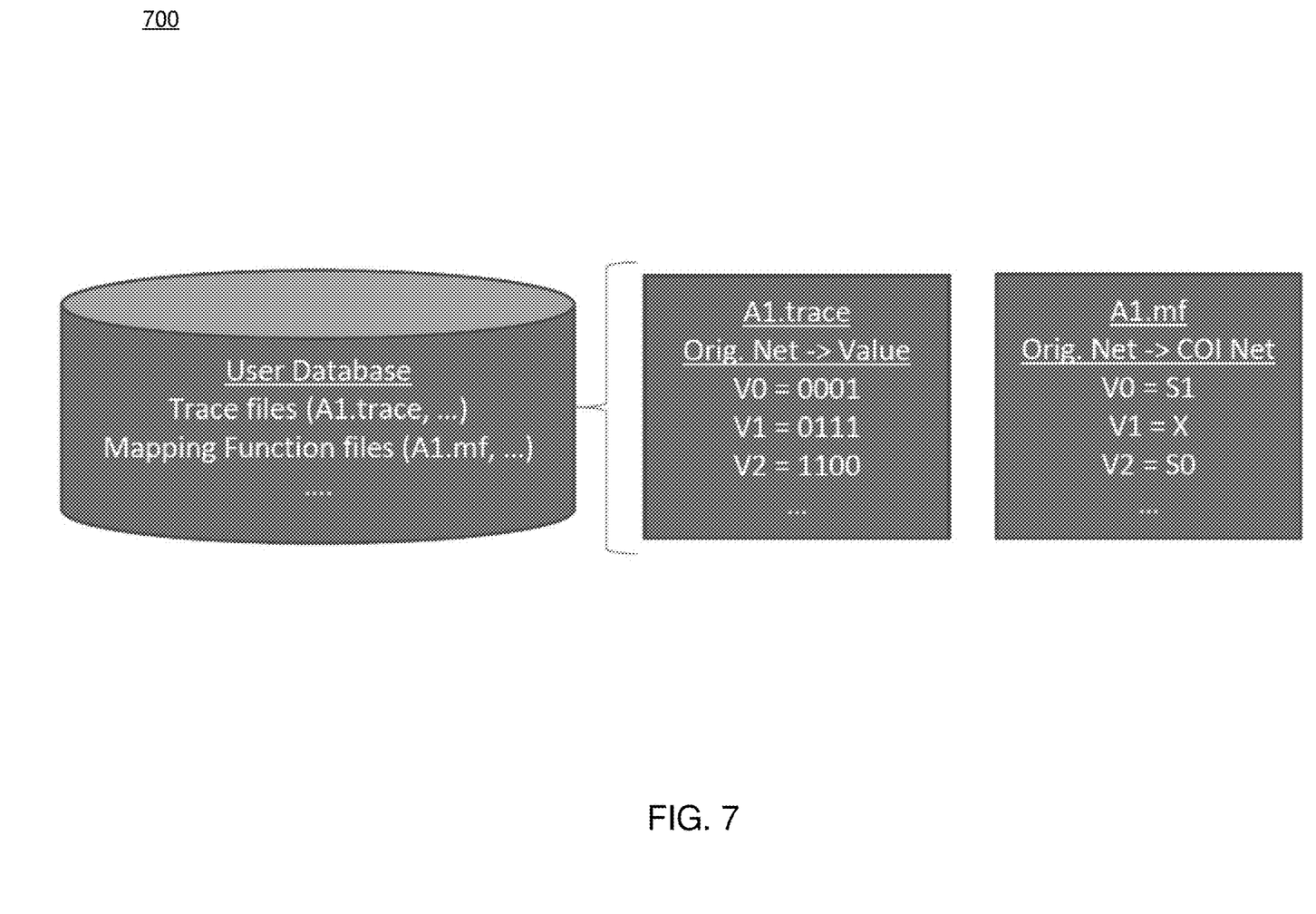
FIG. 7 is an illustration of a schematic of a user database according to some embodiments of the present invention.
Figure 8:
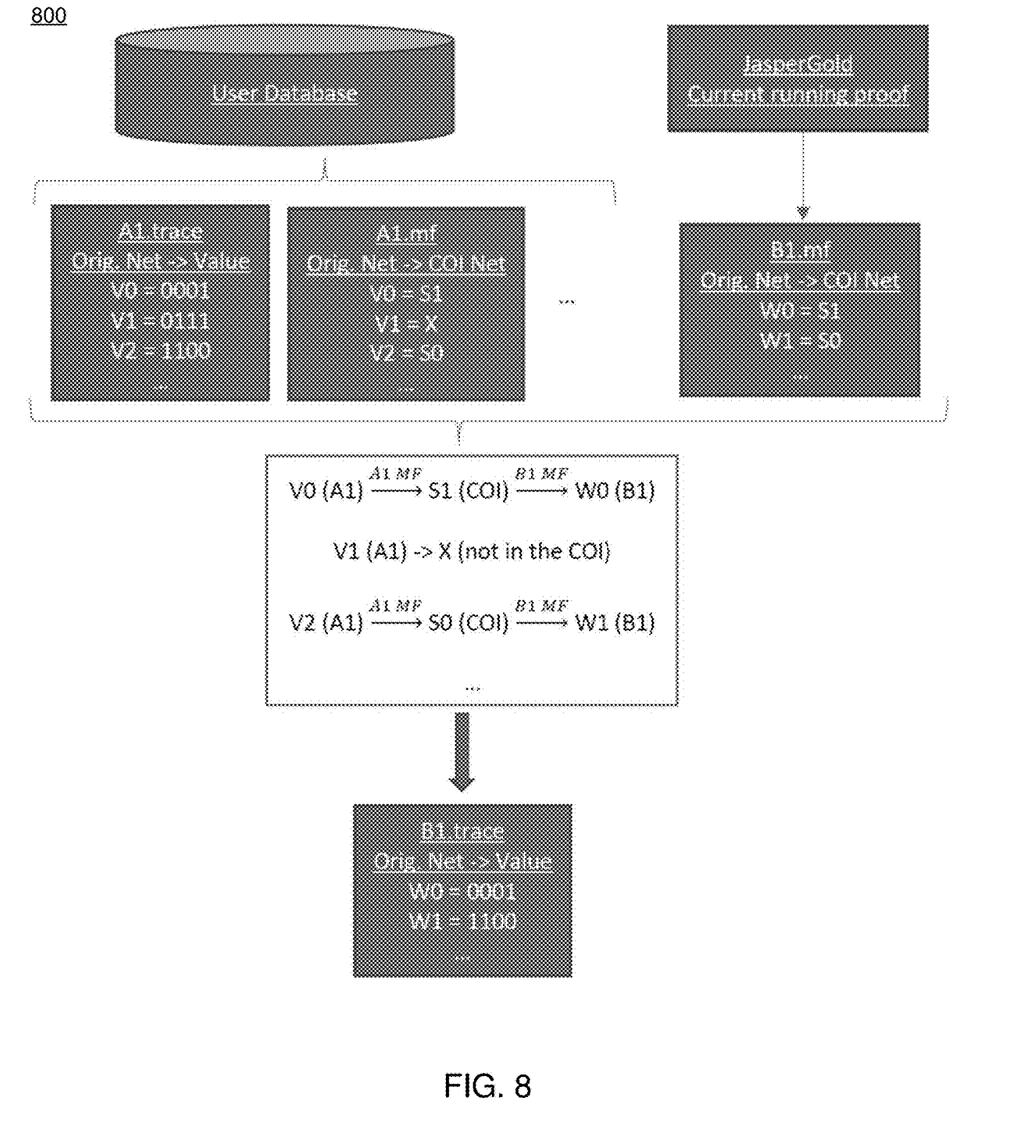
FIG. 8 is an illustration of a trace generation method according to an embodiment of the present disclosure.
Figure 9:
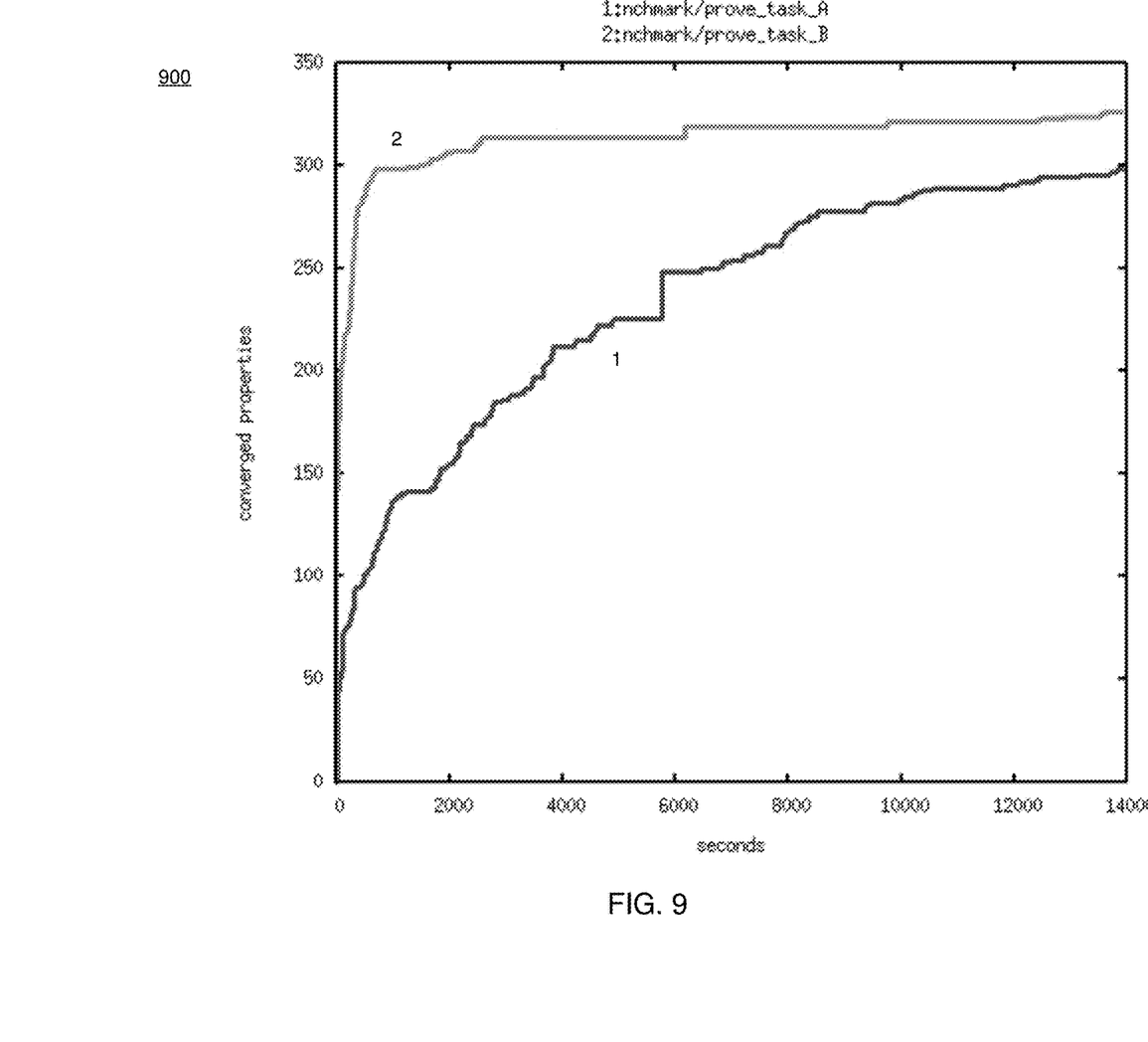
FIG. 9 is a survival plot showing results according to an embodiment of the present disclosure.

Referring now to FIGS. 7-8, additional diagrams depicting another example consistent with embodiments of trace generation process are provided. In operation, for an initial run, the user may set one or more required settings to enable COI-based caching with traces.

% set_prove_cache on
% set_prove_cache_mode coi
% set_prove_cache_traces on

In some embodiments, the user may decide to run a formal proof on task "A". The EDA tool may then compute COI-based signatures and mapping functions for all properties.

% prove -task A
. . .
INFO (IPF153): 0.0.Cache: Starting to compute proof cache signatures
. . .
INFO (IPF154): 0.0.Cache: Finished computing proof cache signatures in 12.46 s
. . .
During the proof, a formal engine finds counterexamples on properties "A1" & "A2" and provides traces.
. . .
INFO (IPF055): 0.0.Ht: A counterexample (cex) with 10000 cycles was found for the property "A1" in 483.06 s.
INFO (IPF055): 0.0.Ht: A counterexample (cex) with 20000 cycles was found for the property "A2" in 587.13 s.
. . .
The EDA tool may cache the computed mapping functions and traces to the user database.

In this example, for a subsequent run, the user may then set required settings to enable COI-based caching with traces.

% set_prove_cache on
% set_prove_cache_mode coi
% set_prove_cache_traces on

The user may then make design changes and run a formal proof on task "B". The EDA tool computes COI-based signatures and mapping functions for all properties.

% prove -task B
. . .
INFO (IPF153): 0.0.Cache: Starting to compute proof cache signatures
INFO (IPF150): 0.0.Cache: Starting to retrieve cached proof results
. . .
INFO (IPF055): 0.0.Cache: A counterexample (cex) with 10000 cycles was found for the property "B1" in 0.00 s.
. . .
INFO (IPF154): 0.0.Cache: Finished computing proof cache signatures in 12.69 s INFO (IPF151): 0.0.Cache: Finished retrieving cached proof results in 6.55 s
. . .
Referring again to FIG. 8, another example consistent with embodiments of trace generation process is provided. In this example, the EDA tool may identify that property B1 has the same COI as previously cached property A1. Therefore, the EDA tool may map the cached "A1.trace" using both cached "A1.mf" and current computed "B1.mf" to generate a new mapped trace "B1.trace" for B1 without running any Formal Engine. A graph (a survival plot) showing number of converged properties per time in both runs is provided in FIG. 9.

Figure 10:
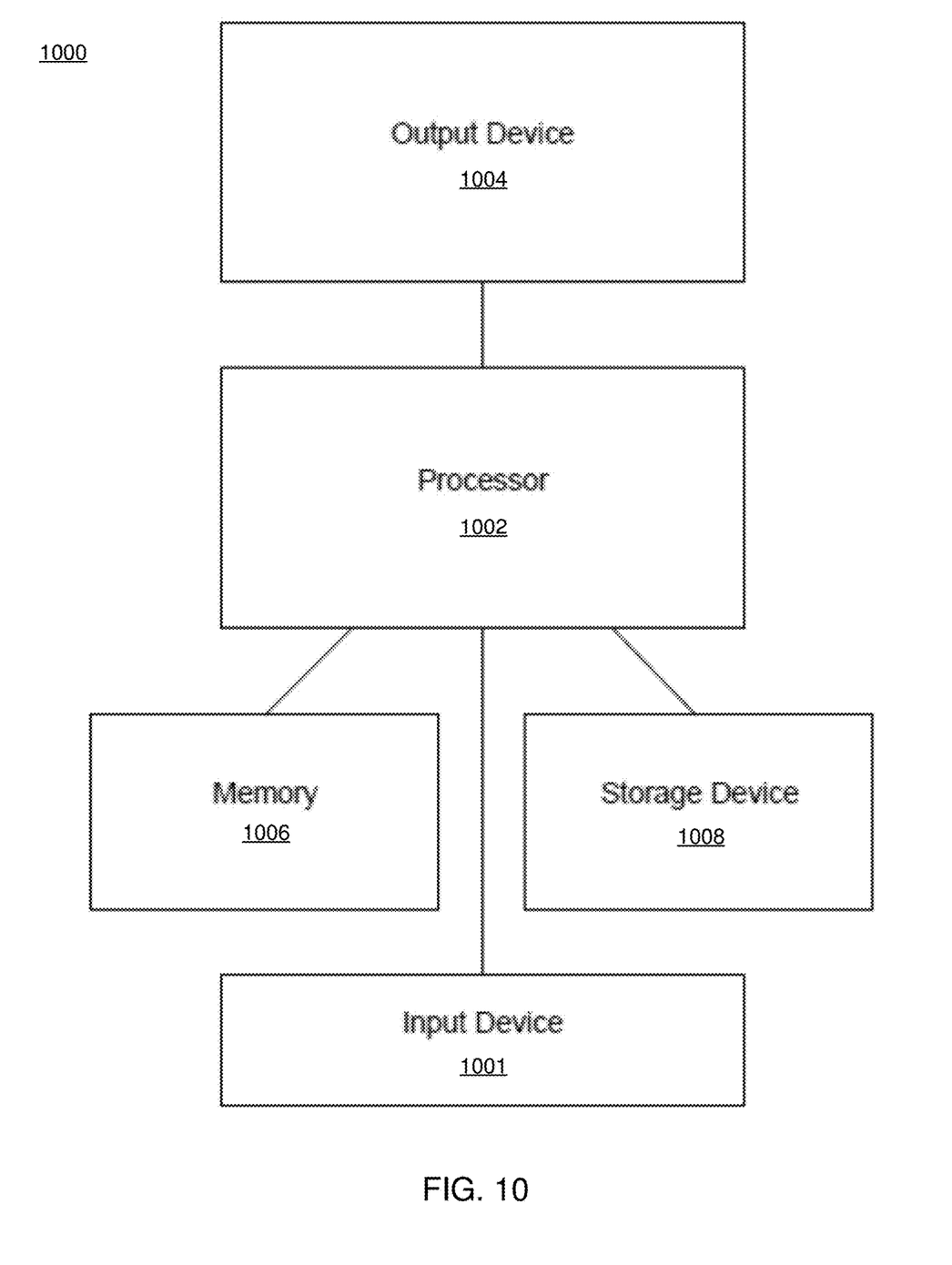
FIG. 10 is a system for assertion-based formal verification, according to some embodiments of the present invention.

FIG. 10 is a system for assertion-based formal verification, according to some embodiments of the present invention. System 1000 may include a processor 1002 (e.g., single processor or a processing unit made that includes a plurality of processors, on a single machine or distributed on a plurality of machines) for executing a method according to some embodiments of the present invention. Processing unit 10002 may be configured to perform a method according to some embodiments of the invention and perform other actions and processing according to some embodiments of the present invention.

Processor 1002 may be linked with memory 1006 on which a program implementing a method according to some embodiments of the present invention and corresponding data may be loaded and from which it may be run, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 1000 may further include an output device 1004 (e.g., display device such as CRT, LCD, LED etc.) on which one or a plurality user interfaces associated with a program implementing a method according to some embodiments of the present invention and corresponding data may be presented. System 1000 may also include input interface 1001, such as, for example, one or a plurality of keyboards, pointing devices, touch sensitive surfaces (e.g. touch sensitive screens), etc. for allowing a user to input commands and data.

Existing approaches lacked a reliable, robust and convenient way to retrieve traces from previous runs when the formal verification environment is changed. The user needed to rerun and consume resources over and over again. Embodiments of the present disclosure address these issues and others.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

What is claimed is:

1. A computer-implemented method for assertion-based formal verification in an electronic design environment comprising:
   executing, using a processor, an assertion-based formal verification proof process on a model of an electronic design;
   analyzing a first property associated with the model;
   generating at least one trace of the first property;
   determining a mapping function associated with the first property;
   storing the at least one trace and the mapping function;
   determining that a second property shares a cone of influence with the first property; and
   generating a new trace based upon, at least in part, the mapping function, wherein the mapping function includes a mapping of one or more nets in the electronic design to their corresponding nets in the cone of influence.

2. The computer-implemented method of claim 1, further comprising:
   computing a second mapping function for the second property.

3. The computer-implemented method of claim 1, wherein the first property is from a first model and the second property is from a second model, wherein the first model and second model are different.

4. The computer-implemented method of claim 1, wherein analyzing includes attempting to disprove the first property.

5. The computer-implemented method of claim 1, wherein generating a new trace is performed without running a formal engine.

6. The computer-implemented method of claim 3, wherein the first model is from a first electronic design and the second model is from a second electronic design.

7. The computer-implemented method of claim 6, wherein the mapping function is based upon, at least in part, one or more nets associated with the first electronic design or second electronic design and one or more corresponding nets in the cone of influence.

8. A non-transitory computer-readable storage medium having stored thereon instructions that when executed by a machine result in the following operations:
   receiving, at a graphical user interface, one or more user settings to enable cone of influence based caching with traces;
   executing, using a processor, an assertion-based formal verification proof process on a task of an electronic design;
   analyzing a first property associated with the task;
   generating at least one trace of the first property;
   determining a cone of influence based signature and a mapping function;
   storing the at least one trace and the mapping function;
   determining that a second property associated with the task shares a cone of influence with the first property; and
   generating a new trace based upon, at least in part, the mapping function, wherein the mapping function includes a mapping of one or more nets in the electronic design to their corresponding nets in the cone of influence.

9. The non-transitory computer-readable storage medium of claim 8, further comprising:
   computing a second mapping function for the second property.

10. The non-transitory computer-readable storage medium of claim 8, wherein the first property is from a first task and the second property is from a second task, wherein the first task and second task are different.

11. The non-transitory computer-readable storage medium of claim 8, wherein analyzing includes attempting to disprove the first property.

12. The non-transitory computer-readable storage medium of claim 8, wherein generating a new trace is performed without running a formal engine.

13. The non-transitory computer-readable storage medium of claim 10, wherein the first task is from a first electronic design and the second task is from a second electronic design.

14. The non-transitory computer-readable storage medium of claim 13, wherein the mapping function is based upon, at least in part, one or more nets associated with the first electronic design or second electronic design and one or more corresponding nets in the cone of influence.

15. A system for assertion-based formal verification in an electronic design environment comprising:
   a computing device having at least one processor configured to execute an assertion-based formal verification proof process on a model of an electronic design, the at least one processor further configured to analyze a first property associated with the model and to generate at least one counterexample and at least one trace of the first property, the at least one processor further configured to determine a mapping function associated with the first property and store the at least one trace and the mapping function, the at least one processor further configured to determine that a second property associated with the model shares a cone of influence with the first property and to generate a new trace based upon, at least in part, the mapping function, wherein the mapping function includes a mapping of one or more nets in the electronic design to their corresponding nets in the cone of influence.

16. The system of claim 15, further comprising:
   a database including one or more trace files or mapping function files.

17. The system of claim 15, further comprising:
   computing a second mapping function for the second property.

18. The system of claim 15, wherein the first property is from a first task and the second property is from a second task, wherein the first task and second task are different.

19. The system of claim 15, wherein analyzing includes attempting to disprove the first property.

20. The system of claim 15, wherein generating a new trace is performed without running a formal engine.

* * * * *